United States Patent [19]

Ghosh et al.

[11] Patent Number: 5,598,556

[45] Date of Patent: Jan. 28, 1997

[54] CONDITIONAL WAIT STATE GENERATOR CIRCUIT

[75] Inventors: Atish Ghosh; Jennifer B. Pencis, both of Austin, Tex.

[73] Assignee: Advanced Micro Devices, Inc., Sunnyvale, Calif.

[21] Appl. No.: 568,849

[22] Filed: Dec. 7, 1995

[51] Int. Cl.⁶ .................................................. G06F 1/12
[52] U.S. Cl. ........................................................ 395/555
[58] Field of Search .............................. 395/550, 306, 395/309, 280, 285

[56] References Cited

U.S. PATENT DOCUMENTS

| | | | |
|---|---|---|---|
| 5,151,986 | 9/1992 | Langan et al. | 395/550 |
| 5,155,812 | 10/1992 | Ehlig et al. | 395/275 |
| 5,201,036 | 4/1993 | Yoshimatsu | 395/325 |
| 5,371,880 | 12/1994 | Bhattacharya | 395/550 |
| 5,448,744 | 9/1995 | Eifert et al. | 395/800 |
| 5,452,434 | 9/1995 | MacDonald | 395/550 |

*Primary Examiner*—Thomas M. Heckler
*Assistant Examiner*—Dennis M. Butler
*Attorney, Agent, or Firm*—Skjerven, Morrill, MacPherson, Franklin & Friel; Stephen A. Terrile; Ken J. Koestner

[57] ABSTRACT

A conditional wait state generator is interposed into the timing circuitry of a processor. The conditional wait state generator provides for analysis of a selected cycle type and for selection of the latency or number of wait states that is imposed during processor execution for that selected cycle type. In accordance with another aspect of the conditional wait state generator, a method of analyzing processor performance under specific operating conditions involves selection of a particular cycle type for testing and selection of a number of wait states that is imposed on processor operations for the selected cycle type and not for other cycle types. A conditional wait state generator is interposed into the timing circuitry of a processor and thereby imposes the selected conditions on the processor for analysis.

11 Claims, 3 Drawing Sheets

CONDITIONAL WAIT STATE GENERATOR CIRCUIT

BACKGROUND OF THE INVENTION

1. Field of the Invention

This invention relates to processor timing circuits. More specifically, this invention relates to a circuit and operating method for generating processor wait states.

2. Description of the Relevant Art

Functional testing of complex circuits, such as microprocessor circuits, involves the measurement of many various operating parameters. Many of these measurements are difficult to perform without special purpose test circuits and procedures.

In one example of such a functional test, the performance of a processor may be tested by measuring the execution time of a particular standard benchmark software routine. These measurements are useful for improving or optimizing processor performance under various operating conditions. One important operating condition of a processor relates to the processor's latency of operation. A wait state is a designation of the latency of a processor, the time interval between the instant at which a call for data is initiated and the instant the actual transfer of the data begins.

One valuable assessment of processor performance is measure of the time taken by a particular standard benchmark software routine to execute as a function of the latency, the number of wait states, of the processor. More specifically, a valuable measure of processor performance involves an analysis of the execution time of the processor as the processor executes a particular type of data access or input/output cycle, such as a read cycle, a write cycle, a read-write cycle or a burst access cycle, for example. Typically, the cycle types tested would encompass every type of data movement and every type of bus activity that is performed by a processor bus.

For some cycle types, variation in the number of wait states only has a marginal effect on the execution time of the processor. For other cycle types, varying the number of wait states greatly influences the execution time of software on the processor.

What is desired is a test apparatus and testing method that facilitate and provide for analysis of processor performance as a function of processor latency. More particularly, what is desired is a test apparatus and testing method that assist an analysis of processor performance when executing a particular type of data access or input/output cycle as a function of processor wait states.

SUMMARY OF THE INVENTION

In accordance with one aspect of the present invention, a conditional wait state generator is interposed into the timing circuitry of a processor. The conditional wait state generator provides for analysis of a selected cycle type and for selection of the latency or number of wait states that is imposed during processor execution for that selected cycle type.

In accordance with a second aspect of the present invention, a method of analyzing processor performance under specific operating conditions involves selection of a particular cycle type for testing and selection of a number of wait states that is imposed on processor operations for the selected cycle type and not for other cycle types. A conditional wait state generator is interposed into the timing circuitry of a processor and thereby imposes the selected conditions on the processor for analysis.

In accordance with one embodiment of the present invention, a timing circuit for generating a selectable number of wait states is provided. These wait state are imposed under a selectable system operating condition in a system which furnishes a timing signal on a timing signal line, a plurality of control signals indicative of a system operating condition on a corresponding plurality of system control signal lines and a clock signal on a clock signal line. The timing circuit includes a programmable selector of system operating condition setting a programmed operating condition and a wait state generation activation circuit connected to the plurality of system control signal lines and connected to the programmable selector of system operating condition. The wait state generation is activated when the system operating condition matches the programmed operating condition. The wait state generation is otherwise inactivated. A timing signal pass-through circuit is connected to the wait state generation activation circuit and connected to the timing signal line for passing through the timing circuit when the wait state generation is inactivated. A programmable selector of wait state delay number sets a programmed timing delay. A wait state counter is connected to the clock signal line and connected to the wait state generator activation circuit. The wait state counter counts a number of clock signals when the wait state generation is activated. The timing signal further includes a timing signal delay circuit connected to the wait state counter and connected to the programmable selector of wait state delay. The timing signal delay circuit delays the timing signal until the number of clock signals counted by the wait state counter reaches the programmed timing delay.

In accordance with another embodiment of the invention, a method of generating a selectable number of wait states is furnished. These selectable wait states are imposed under a selectable system operating condition in a system furnishing a timing signal on a timing signal line, a plurality of control signals indicative of a system operating condition on a corresponding plurality of system control signal lines and a clock signal on a clock signal line. The method includes steps of setting a programmed operating condition, comparing the programmed operating condition to the system operating condition and activating a wait state generation operation when the system operating condition matches the programmed operating condition. Otherwise, the wait state generation operation is inactivated. The method further includes the steps of passing through the timing circuit when the wait state generation is inactivated. When the wait state generation is activated, the method includes the steps of setting a programmed timing delay, counting a number of clock signals when the wait state generation is activated and delaying the timing signal until the number of clock signals counted by the wait state counter reaches the programmed timing delay.

Various advantages are achieved by the disclosed conditional wait state generator and operating method. One advantage is that the conditional wait state generator allows for isolation of a selected processor operating condition or group of operating conditions and for analysis of processor performance with respect to that operating condition alone. Another advantage is that this analysis of an isolated selected processor operating condition is reflected in overall system throughput. It is further advantageous that numerous different isolated processor operating conditions or group of operating conditions are selectable for analysis.

It is further advantageous that the conditional wait state generator facilitates the analysis of processor performance for a particular selected cycle type or set of types. For example, the conditional wait state generator may be used to determine whether optimization of a particular processor functionality is worthwhile. If processor performance remains nearly the same while the number of wait states is widely varied, optimization of processor functionality is not warranted. However, substantial degradation in processor performance which results from changes in processor wait state latency indicates that processor optimization is advantageous.

Still additional advantages are achieved due to the large number of wait states, corresponding to a long latency, that may be imposed under operating conditions such as conditions that occur during a large number of cache memory accesses.

The disclosed conditional wait state generator and operating method are also advantageous for greatly improving the efficiency of benchmark testing. Real time testing of software operating on a processor does not typically allow isolation of particular operating conditions on the basis of cycle type and latency. Such testing would typically take many hours of simulation to test using conventional simulation techniques.

BRIEF DESCRIPTION OF THE DRAWINGS

The present invention may be better understood, and its numerous objects, features, and advantages made apparent to those skilled in the art by referencing the accompanying drawings.

DETAILED DESCRIPTION OF THE INVENTION

The following sets forth a detailed description of the best contemplated mode for carrying out the invention. The description is intended to be illustrative of the invention and should not be taken to be limiting.

Figure 1:
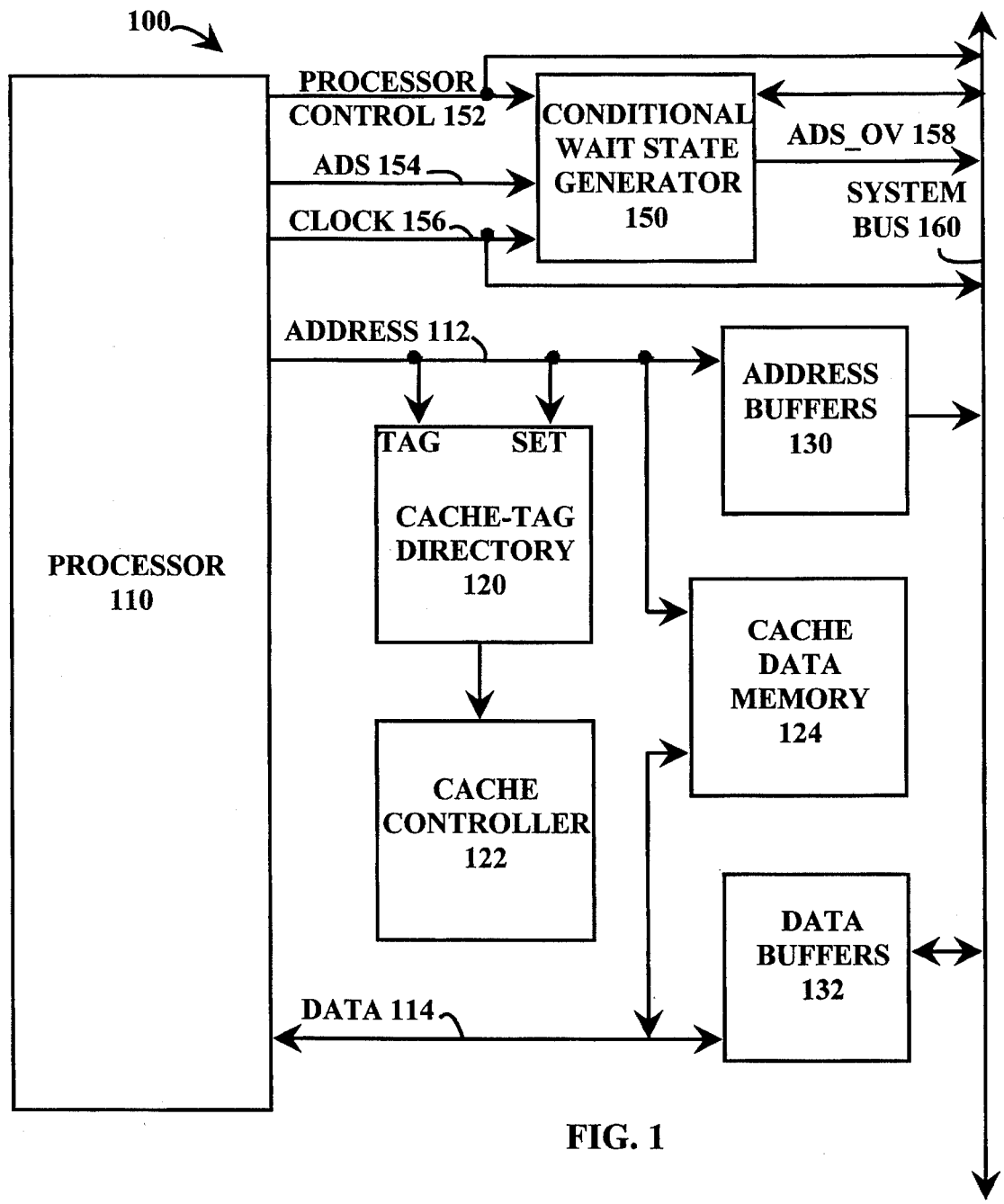
FIG. 1 is a schematic block diagram showing an exemplary computer system into which a conditional wait state generator is implemented.

Referring to FIG. 1, an exemplary embodiment of a computer system circuit 100 is shown which incorporates a conditional wait state generator 150. In this example, the conditional wait state generator 150 receives processor control signals 152, an address strobe signal (ADS#) 154 and a clock signal 156 from a processor 110. The conditional wait state generator 150 inserts wait states which modify the address strobe signal so that a modified address strobe signal (ADS$_{13}$ OV#) is transferred to a system bus 160. In this example, the processor 110 is connected to a set-associative cache which includes a cache-tag directory 120, a cache controller 122 and a cache data memory 124. Address buffers 130 and data buffers 132 are interposed between the processor 110 and the system bus 160 and main memory (not shown) which is typically connected to the system bus 160. Although the conditional wait state generator 150 may be utilized in many processor system structures, including structures which do not include a cache, a processor system which includes a cache memory is depicted in this example because performance of a processor system which includes a cache is advantageously tested using the conditional wait state generator 150.

Figure 2:
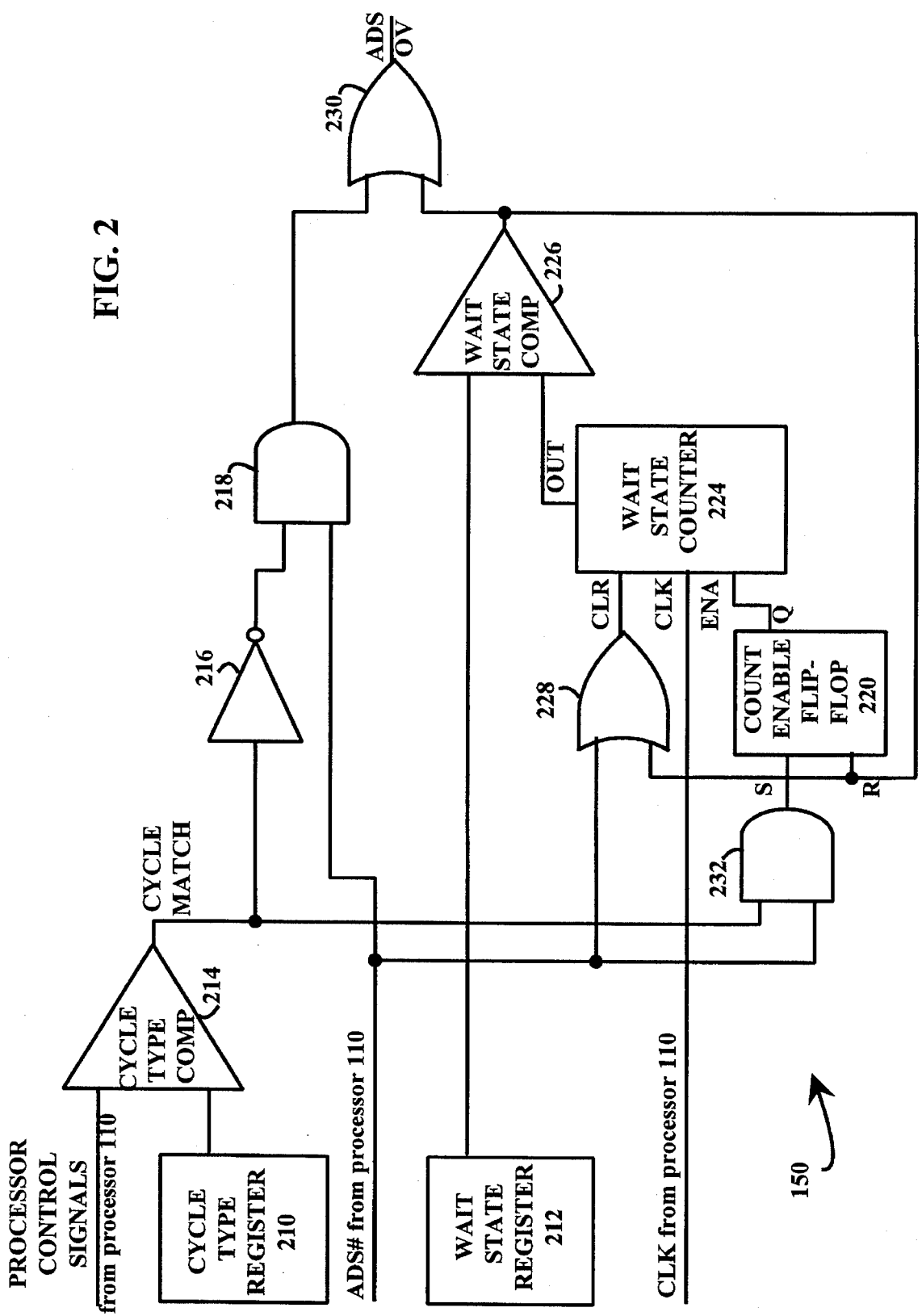
FIG. 2 is a schematic circuit diagram which illustrates an embodiment of a conditional wait state generator in accordance with the present invention.

Referring to FIG. 2, a schematic circuit diagram shows an embodiment of a conditional wait state generator 150, which is used to generate wait states for a microprocessor. The number of wait states generated is determined by the type of memory access in progress. In this embodiment, an address strobe signal (ADS#) starts a bus cycle, for example for the purpose of initiating a memory or input/output access, and is applied to the conditional wait state generator 150. The conditional wait state generator 150 delays the ADS# signal for a cycle or set of cycles under test, but does not delay the ADS# signal for other cycle types. Examples of cycles under test include data access cycles such as memory read cycles, memory write cycles, I/O read cycles, I/O write cycles, read-write cycles and burst access cycles. All signals are shown active high to improve clarity of operation of the circuit.

The conditional wait state generator 150 receives input signals including processor control signals on processor control signal lines, an address strobe (ADS#) signal and a clock signal on a CLK line. The address strobe (ADS#) signal is used by external bus circuitry to indicate that the processor has started a bus cycle. An external system may sample the bus cycle definition pins on the next rising edge of the clock after ADS# is driven active. The ADS# signal is driven active in the first clock of a bus cycle and is driven inactive in the second and subsequent clocks of the cycle. The ADS# signal is driven inactive when the bus is idle. The clock signal on the CLK line furnishes the fundamental timing for a processor and typically corresponds to the operating frequency of the processor. The clock signal serves as a reference timing signal for sampling other signals. Processor control signals are various control signals for controlling the operation of a processor. Examples of a processor control signal is a write/read (W/R#) signal. The write/read (W/R#) signal is a fundamental bus cycle definition signal, which distinguishes between processor read and write cycles. The W/R# signal is driven valid in the same clock as the ADS# signal is asserted.

The conditional wait state generator also includes a cycle type register 210 and a wait state register 212. The cycle type register 210 holds a digital value indicative of the cycle type to be tested. Testing of multiple cycles is achieved by setting multiple control bits of the cycle type register 210. The multiple control bits are logically combined to test multiple cycles. The wait state register 212 is programmed to a wait state count that sets the count for the cycle type to be tested that is set in the cycle type register 210. In the illustrative embodiment, the wait state register 212 has a bit width of five bits. This number of bits is useful for extending the latency a relatively large amount for testing various conditions such as processor performance during a large number of cache memory accesses. The cycle type register 210 and wait state register 212 are programmable and influence the operation of the conditional wait state generator 150 on the basis of that programming.

A cycle type comparator 214 has a first multiple-bit input terminal that is connected to the processor control signal lines and a second multiple-bit input terminal that is connected to the cycle type register. The cycle type comparator 214 compares the processor control signals to the digital value set in the cycle type register 212 on a bitwise basis so that a cycle match output signal of the cycle type comparator 214 becomes active when a match occurs. When a match occurs and the cycle type comparator 214 is active, the count enable flip-flop 220 is set, enabling a wait state counter 224. When enabled, the wait state counter 224 counts until the count is equal to the value programmed in the wait state register 212, as determined by a wait state comparator 226, at which time the delayed ADS#signal is output by the conditional wait state generator 150. Each delay increment programmed in the wait state counter 224 is one clock cycle in duration. The output signal of the wait state comparator 226 is applied to reset the count enable flip-flop 220.

When no match occurs, the ADS# signal is passed unchanged through the conditional wait state generator 150.

The cycle match signal is applied to an inverter 216 and an AND gate 218. AND gate 218 is a two-input AND gate having a first input terminal connected to the cycle match signal line and a second input terminal connected to receive the address strobe (ADS#) signal. When both the ADS# signal and the cycle match signal are active, AND gate 218 becomes active so that a count enable flip-flop 220 is set. The count enable flip-flop 220 has a set input terminal that is connected to the output of the AND gate 218 and an input reset terminal that is connected to the output terminal of a wait count comparator 222. The count enable flip-flop 220 has a Q output terminal that is connected to a count enable input terminal of a wait state counter 224. The count enable flip-flop 220 controls the counter of the wait state counter 224. A count enable flip-flop 220 Q output signal of "1" enables the wait state counter 224 while a Q output signal of "0" disables the wait state counter 224. The count enable flip-flop 220 is set when an address strobe (ADS#) signal is active and the cycle match signal is asserted. The count enable flip-flop 220 is reset when the wait state count is attained and a count match signal is generated. The count match signal is generated by a wait state comparator 226. The wait state comparator 226 has a first digital input terminal which is connected to the wait state register 212 and a second digital input terminal connected to an output terminal of the wait state counter 224. The wait state comparator 226 compares the value of the current wait state count in the wait state counter 224 with the programmed value in the wait state register 212 and generates the count match signal which becomes active when the wait state count value is equal to the programmed wait state register 212 value. The count match signal is active and valid for exactly one clock signal.

The wait state counter 224 has a clear input terminal connected through an OR gate 228. The OR gate 228 has a first input terminal connected to the address strobe (ADS#) line and a second input terminal connected to the count match signal. The OR gate 228 is thus a two-input OR gate that is used to clear the wait state counter 224. The wait state counter 224 is a multiple-bit counter for counting wait states. In the illustrative embodiment of the conditional wait state generator 150, the wait state counter 224 is a five-bit counter. The wait state counter 224 is clear when an address strobe is asserted at the start of a cycle and is also asserted when a count match signal is asserted when the current count is complete. The clock of the wait state counter 224 is the same as the processor clock so that the value in the wait state counter 224 is a count in time units that are equal to processor clock time units. The wait state counter 224 only counts when the output of the count enable flip-flop 220 is asserted to a "1" value.

An address strobe (ADS#) select OR gate 230 is a two input OR gate that selects an address strobe signal from either the input ADS# line or the delayed address strobe signal from the output terminal of the wait state comparator 226. The ADS# select OR gate 230 has a first input terminal that is connected to the output terminal of the wait state comparator 226 and a second input terminal that is connected to the output terminal of a pass-through AND gate 232. The pass-through AND gate 232 is a two-input AND gate having a first input terminal connected to the address strobe (ADS#) line and a second input terminal connected to an inverted cycle match signal that is output by the cycle type comparator 214 and inverted by inverter 216. Accordingly, the pass-through AND gate 232 generates a signal that is the AND of the address strobe (ADS#) signal and the inversion of the cycle match signal. The output signal from the pass-through AND gate 232 is active when the address strobe signal is active and the current cycle type is not the program-requested cycle type. In this manner the conditional wait state generator 150 passes through the address strobe (ADS#), unchanged, unless the processor control signals correspond to the cycle type that is written in the cycle type register 210.

Figure 3:
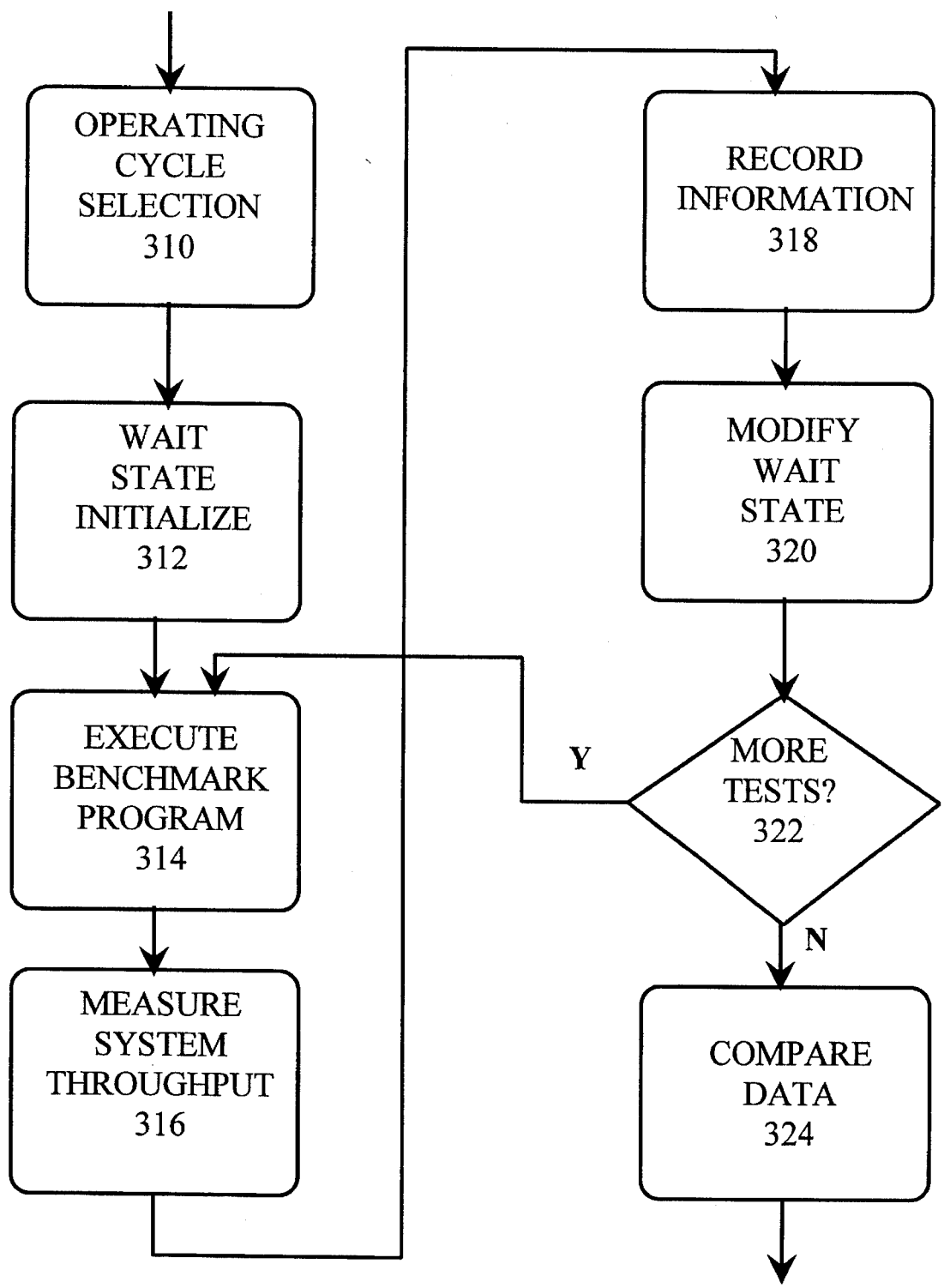
FIG. 3 is a flowchart which depicts steps of a processor analysis procedure.

Referring to FIG. 3, a flowchart of a processor analysis procedure is shown. In operating cycle selection step 310, a particular test operating condition is selected by programming the cycle type register 210. The latency is initialized in wait state initialize step 312, typically with the number of wait states set to a small value, such as zero. Execute benchmark program step 314 begins the running of the benchmark program for analyzing processor function. In measure system throughput step 316, execution time is measured for completion of a benchmark test routine. Record information step 318 updates a test record including recordation of the number of wait states and the corresponding execution time. Modify wait state step 320 modifies the number of wait states for a next test condition. Typically, the number of wait states is incremented, often by a single count. If the processor is to be tested for further wait state counts, more tests step 322 loops to execute benchmark program step 314. Otherwise, compare data step 324 is invoked to compare the execution time for different wait states. One technique for comparing processor performance over a number of wait state latencies is to graph the information.

Other Embodiments

While the invention has been described with reference to various embodiments, it will be understood that these embodiments are illustrative and that the scope of the invention is not limited to them. Many variations, modifications, additions, and improvements of the embodiments described are possible.

For example, the illustrative circuit may be replaced by other equivalent circuits which perform the same cycle type selection, wait state selection and wait state generation operations. Although the illustrative circuit utilizes active high logic, other logic conventions may be implemented while remaining within the scope of the invention.

Furthermore, the conditional wait state generator may be implemented in various other processor systems, including many systems which implement a variety of different cache structures or systems which do not include a cache.

These and other variations, modifications, additions, and improvements may fall within the scope of the invention as defined in the claims which follow.

What is claimed is:

1. A timing circuit for generating a selectable number of wait states which are imposed on a processor system under a selectable operating condition, the processor furnishing a timing signal on a timing signal line, a plurality of processor control signals indicative of a processor operating condition on a corresponding plurality of processor control signal lines and a clock signal on a clock signal line, the timing circuit comprising:

a programmable selector of processor operating condition setting a programmed operating condition;

a wait state generation activation circuit coupled to the plurality of processor control signal lines and coupled to the programmable selector of processor operating condition, the wait state generation being activated when the processor operating condition matches the programmed operating condition and the wait state generation being otherwise inactivated;

a timing signal pass-through circuit coupled to the wait state generation activation circuit and coupled to the timing signal line for passing through the timing circuit when the wait state generation is inactivated;

a programmable selector of wait state delay number setting a programmed timing delay;

a wait state counter coupled to the clock signal line and coupled to the wait state generator activation circuit for counting a number of clock signals when the wait state generation is activated; and a timing signal delay circuit coupled to the wait state counter and coupled to the programmable selector of wait state delay for delaying the timing signal until the number of clock signals counted by the wait state counter reaches the programmed timing delay.

2. A timing circuit according to claim 1 wherein the processor operating condition is a type of processor timing cycle.

3. A timing circuit according to claim 1 wherein the timing signal is an address strobe (ADS#) signal.

4. A timing circuit for generating a selectable number of wait states which are imposed on a processor system under a selectable operating condition, the processor furnishing a timing signal on a timing signal line, a plurality of processor control signals indicative of a processor operating condition on a corresponding plurality of processor control signal lines and a clock signal on a clock signal line, the timing circuit comprising:

a programmable cycle type register setting a programmed operating condition;

a first comparator coupled to the plurality of processor control signal lines and coupled to the programmable selector of processor operating condition, the first comparator generating a signal indicative of whether the processor operating condition matches the programmed operating condition;

a logic circuit coupled to the first comparator and coupled to the timing signal line and activated by the comparator to pass through the timing signal when the processor operating condition does not match the programmed operating condition;

a flip-flop having a set input terminal coupled to the first comparator and coupled to the timing signal line, a reset terminal and an output terminal;

a wait state counter having a count enable input terminal coupled to the output terminal of the flip-flop, a clock input terminal coupled to the clock signal line and an output terminal;

a programmable wait state register setting a programmed wait state number;

a second comparator coupled to the programmable wait state register and coupled to the output terminal of the wait state counter, the second comparator generating a delayed timing signal delayed the programmed wait state number.

5. A timing circuit according to claim 4 wherein the processor operating condition is a type of processor timing cycle.

6. A timing circuit according to claim 4 wherein the timing signal is an address strobe (ADS#) signal.

7. A timing circuit according to claim 4 wherein the wait state counter further includes a clear input terminal coupled, in combination, to the second comparator to receive the delayed timing signal and to the timing signal line so that either the timing signal or the delayed timing signal are applied to the clear input terminal.

8. A timing circuit for generating a selectable number of wait states which are imposed under a selectable system operating condition in a system furnishing a timing signal on a timing signal line, a plurality of control signals indicative of a system operating condition on a corresponding plurality of system control signal lines and a clock signal on a clock signal line, the timing circuit comprising:

a programmable selector of system operating condition setting a programmed operating condition;

a wait state generation activation circuit coupled to the plurality of system control signal lines and coupled to the programmable selector of system operating condition, the wait state generation being activated when the system operating condition matches the programmed operating condition and the wait state generation being otherwise inactivated;

a timing signal pass-through circuit coupled to the wait state generation activation circuit and coupled to the timing signal line for passing through the timing circuit when the wait state generation is inactivated;

a programmable selector of wait state delay number setting a programmed timing delay;

a wait state counter coupled to the clock signal line and coupled to the wait state generator activation circuit for counting a number of clock signals when the wait state generation is activated; and a timing signal delay circuit coupled to the wait state counter and coupled to the programmable selector of wait state delay for delaying the timing signal until the number of clock signals counted by the wait state counter reaches the programmed timing delay.

9. A timing circuit according to claim 8 wherein the processor operating condition is a type of system timing cycle.

10. A timing circuit according to claim 8 wherein the timing signal is an address strobe (ADS#) signal.

11. A method of generating a selectable number of wait states which are imposed under a selectable system operating condition in a system furnishing a timing signal on a timing signal line, a plurality of control signals indicative of a system operating condition on a corresponding plurality of system control signal lines and a clock signal on a clock signal line, the method comprising the steps of:

setting a programmed operating condition;

comparing the programmed operating condition to the system operating condition;

activating a wait state generation operation when the system operating condition matches the programmed operating condition;

inactivating the wait state generation operation otherwise;

passing through the timing circuit when the wait state generation is inactivated;

setting a programmed timing delay;

counting a number of clock signals when the wait state generation is activated; and delaying the timing signal until the number of clock signals counted by the wait state counter reaches the programmed timing delay.

\* \* \* \* \*